United States Patent [19]

Sugawa et al.

[11] 4,150,394
[45] Apr. 17, 1979

[54] FLAT PACKAGE SEMICONDUCTOR DEVICE HAVING HIGH EXPLOSION PREVENTING CAPACITY

[75] Inventors: Yoshiyuki Sugawa, Itami; Yoshiro Shikano, Amagasaki, both of Japan

[73] Assignee: Mitsubishi Denki Kabushiki Kaisha, Tokyo, Japan

[21] Appl. No.: 844,069

[22] Filed: Oct. 20, 1977

[30] Foreign Application Priority Data

Oct. 28, 1976 [JP] Japan .................. 51-130271

[51] Int. Cl.² .............. H01L 23/02; H01L 23/12; H01L 23/28
[52] U.S. Cl. .................. 357/74; 357/72; 357/79; 357/81
[58] Field of Search ............. 357/79, 72, 81, 74

[56] References Cited

U.S. PATENT DOCUMENTS

| | | | |
|---|---|---|---|
| 3,566,958 | 3/1971 | Zelina | 357/81 |
| 3,581,160 | 5/1971 | Piccone | 357/79 |
| 3,651,383 | 3/1972 | Livezey | 357/81 |
| 3,721,867 | 3/1973 | Schierz | 357/79 |
| 3,975,758 | 8/1976 | Schlegel | 357/81 |
| 3,992,717 | 11/1976 | Rice | 357/79 |
| 4,008,486 | 2/1977 | Byczkowski | 357/81 |

*Primary Examiner*—Andrew J. James
*Attorney, Agent, or Firm*—Wenderoth, Lind & Ponack

[57] ABSTRACT

A semiconductor element is disposed within a hollow cylindrical, electrically insulating member. The member has each of opposite open ends closed with a respective electrode of the element and a piece of thin sheet metal to form an annular space on either side of the semiconductor element. A silicone rubber layer is attached to that surface of the metallic piece facing the semiconductor element, and a high thermally resisting ceramic annulus is buried in the layer.

5 Claims, 2 Drawing Figures

FLAT PACKAGE SEMICONDUCTOR DEVICE HAVING HIGH EXPLOSION PREVENTING CAPACITY

BACKGROUND OF THE INVENTION

This invention relates to improvements in a semiconductor device, and more particularly to a high power semiconductor device including means for preventing a secondary accident from occuring due to failure of the device.

Semiconductor devices such as semiconductor rectifier diodes, thyristors, etc., gradually increase in capacity, and there have been proposed a variety of circuits employing such high capacity semiconductor devices. However, if the failure of defect of such high capacity semiconductor devices themselves is attended with the flow of excessive fault current through the devices, then the excessive fault current strikes an electric arc on the failed or defective semiconductor device to increase more and more the danger that circuitry adjacent to the arced device will be damaged. Therefore, it has previously been common practice to dispose protective fuses externally of high power semiconductor devices to interrupt the excessive fault current. With a current capacity during normal operation exceeding 1,000 amperes, the protective fuse is required to increase in current capacity. However, if the protective fuse increases in current capacity, then the interrupting time thereof becomes accordingly long with the result that electrical energy on the order of several hundred kilowatt-seconds is generated within the arced semiconductor device until the protective fuse is fused off after the semiconductor device has been failed.

Upon the occurrence of a fault on a relatively central portion of the particular semiconductor substrate, the resulting fault current is conducted externally of the associated semiconductor device through electrodes connected to the substrate. Upon the occurrence of a fault on a relatively outer peripheral portion of the semiconductor substrate, the resulting fault current is concentrated on the fault portion until that portion has a very high current density. This results in the generation of a large quantity of electric energy on the fault portion sufficient to melt the semiconductor substrate or a metallic portion such as a diaphragm forming one part of an associated semiconductor device. Therefore, an electric arc at an elevated temperature is struck and sent forth externally of the semiconductor device. Under these circumstances, when an electrically charged portion is present externally of and adjacent to the arced device, the electric arc may shortcircuit the device with the charged portion, thus resulting in a serious accident such as an unexpected fire. Alternatively, high temperature gases evolved within the semiconductor device may be abruptly expanded, thus resulting in the danger that an enclosure for the semiconductor device might explode through that portion thereof having the lowest strength.

As above described, the manufacture of high capacity semiconductor devices might be attended with the danger that a fault occuring in such semiconductor devices will lead to a very significant accident.

Accordingly, it is an object of the present invention to provide a new and improved semiconductor device effective for preventing the abovementioned fault that may occur in high capacity semiconductor devices from resulting in the failure of an associated circuitry.

It is another object of the present invention to provide a new and improved semiconductor device free from the danger that an excessive fault current flowing through the device will lead to an explosion.

SUMMARY OF THE INVENTION

The present invention provides a semiconductor device comprising a semiconductor element including a pair of main opposite faces, an electrically insulating member in the form of a hollow cylinder having both opposite ends open, the semiconductor element being disposed within the electrically insulating member, and a pair of electrodes disposed in ohmic contact with the main opposite faces of the semiconductor element respectively, each of the electrodes closing an adjacent one of the open ends of the electrically insulating member through a piece of thin sheet metal, to form an annular space within the electrically insulating member with the piece of thin sheet metal and the semiconductor element. The semiconductor device further comprises a high thermally resisting, electrically insulating member disposed in each of the annular spaces and an adhesive, electrically insulating layer attached to a surface of each piece of thin sheet metal facing the semiconductor element to carry the high thermally resisting, electrically insulating member.

Preferably the high thermally resisting, electrically insulating member may be formed of an electrically insulating material higher in thermal resistance than the material of the adhesive, electrically insulating layer.

Advantageously, the adhesive, electrically insulating layer may be composed of a silicone rubber, and the high thermally resisting, electrically insulating member may be composed of a ceramic material.

BRIEF DESCRIPTION OF THE DRAWINGS

The present invention will become more readily apparent from the following detailed description taken in conjunction with the accompanying drawing in which.

DESCRIPTION OF THE PREFERRED EMBODIMENTS

Figure 1:
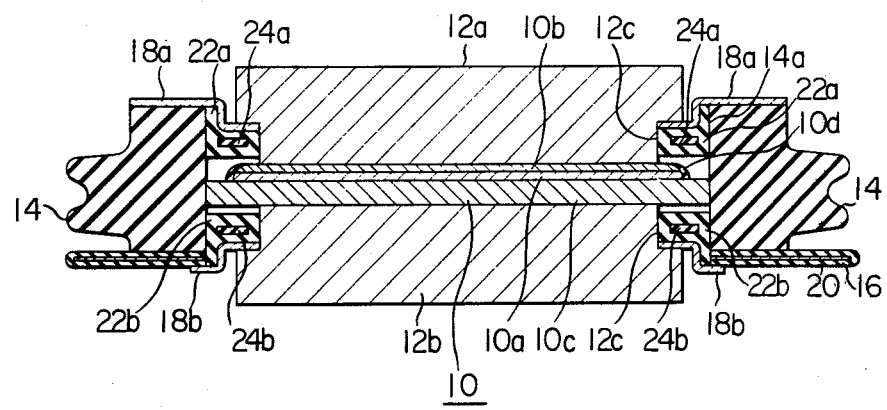
FIG. 1 is a cross sectional view of a planar semiconductor device constructed in accordance with the principles of the present invention.

Referring now to FIG. 1 of the drawings, there is illustrated a planar semiconductor device constructed in accordance with the principles of the present invention. The arrangement illustrated comprises a semiconductor element generally designated by the reference numeral 10 including a circular silicon substrate 10a having at least one PN junction (not shown) disposed therein, a metallic electrode 10b disposed in ohmic contact with one of the main faces, in this case the upper main face as viewed in FIG. 1, of the substrate 10a as by vacuum evaporation technique, a supporting plate 10c formed, for example, of molybdenum and attached to the other main face of the substrate 10a and a surface coating 10d for protecting that portion of the PN junction (not shown) exposed to the surface of the substrate 10a. Then a pair of circular electrodes 12a and 12b are maintained in contact with the electrode 10b and the supporting plate 10c, respectively. Both electrodes 12a and 12b may be preferably formed of copper.

An electrically insulating member 14 in the form of a hollow cylinder having both opposite ends open and composed of a ceramic material or the like encircles the semiconductor element 10a, the supporting plate 10c and the electrodes 12a and 12b while carrying both electrodes in electrically insulating relationship as will be subsequently described. The insulating member 14 has an annular weld flange 16 brazed to one of the opposite open ends, in this case the lower open end, thereof through a weld annulus 20 that includes a pair of superposed layers having the flange 16 sandwiched therebetween. The other or upper open end of the insulating member 14 is resiliently connected to the upper circular electrode 12a through an annular diaphragm 18a formed of a piece of any suitable thin sheet metal, while the lower open end of insulating member 14 is resiliently connected to the lower electrode 12b through an annular diaphragm 18b brazed at the outer periphery thereof to the weld annulus 20 and suitably attached at the inner periphery thereof to the electrode 12b. The annulus 20 has its outer periphery arc-welded to the weld flange 16.

Thus it is seen that a hermetic housing is formed of the electrodes 12a and 12b, the cylindrical insulating member 14, the weld flange 16, the diaphragms 18a and 18b and the weld annulus 20 and has the semiconductor element 10 accommodated therein. The semiconductor element 10 has its peripheral surface substantially contacting the internal surface of the insulating member 14 to form spaces defined by the insulating member 14 and the diaphragm 18a and 18b on opposite sides of element 10.

Within each of the spaces thus formed an adhesive, electrically insulating layer 22a or 22b is attached to that surface of the diaphragm 18a or 18b facing the semiconductor element 10. Each layer 22a and 22b is annular and has an outer periphery contacted by the inner peripheral wall 14a of the cylindrical insulating member 14 and an inner periphery contacted by surface 12c of the electrodes 12a or 12b. The insulating layers 22a and 22b are formed of a silicone rubber, because such a rubber has good adhesion to metals and can easily be adhered to the electrodes 12a or 12b. Each silicone rubber layer 22a and 22b has a thickness dependent upon the current capacity of the particular semiconductor element. Assuming that the semiconductor element 10 has a current capacity of 1,000 amperes, the thickness of the silicone rubber layers 22a and 22b is preferably on the order of several millimeters.

As shown in FIG. 1, high thermally resisting, electrically insulating annuli 24a and 24b formed of any suitable ceramic material are buried in the silicone rubber layers 22a and 22b, respectively. Each annulus has a thickness also dependent upon the current capacity of the particular semiconductor element. Under the assumed condition as above described, the thickness of the annuli 24a and 24b preferably ranges from 0.5 to 1 millimeter for practical purposes.

As an example, a method of manufacturing the structure shown in FIG. 1 will now be described. The diaphragm 18a is first attached at the inner peripheral edge thereof to the outer periphery 12c of the electrode 12a and then on the outer peripheral edge portion to the upper open end of the insulating member 14 to form such three elements into a unitary structure. This results in an annular groove having a bottom formed of the diaphragm 18a and opposite lateral walls formed of the inner wall 12c of the electrode 12a and the inner wall 14a of the insulating member 14, respectively.

Thereafter a suitable amount of a silicone rubber vulcanizable at room temperature flows into the annular groove thus formed, and then a ceramic annulus is forced into the silicone rubber until the silicone rubber is vulcanized to form the silicone rubber layer 22a having the ceramic annulus 24a embedded therein.

On the other hand, the diaphram 18b is attached at the inner peripheral edge thereof to the outer periphery 12c of the electrode 12b. Then the diaphragm 18b is temporarily provided on the outer peripheral edge thereof with a jig (not shown) to define an inner wall equal to that to be defined by the insulting member 14, the weld flange 16 and the weld annulus 20 to form an annular groove. As above described in conjunction with the silicone rubber layer 22a and the insulating annulus 24a, similar silicone rubber is poured into the groove thus formed, and a ceramic annulus is forced into the silicone rubber to form the silicone rubber layer 22b having the ceramic annulus 24b embedded therein.

Following this, the semiconductor element 10 separately formed is put between the electrodes 12a and 12b, the jig is removed, and the weld flange 16 is arc-welded to the weld annulus 20. The resulting structure is shown in FIG. 1.

Figure 2:
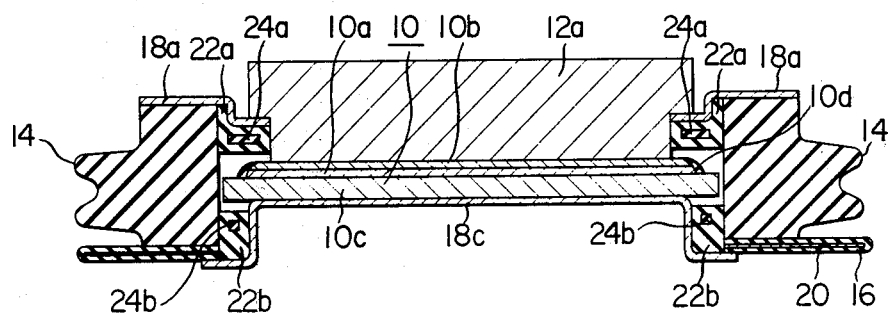
FIG. 2 is a view similar to FIG. 1 but illustrating a modification of the present invention.

In a modification of the present invention illustrated in FIG. 2, wherein like reference numerals designate components identical to those shown in FIG. 1, the electrode 12b shown in FIG. 1 is replaced by a diaphragm 18c including a peripheral portion identical in shape to the diaphragm 18b shown in FIG. 1 and a central flat portion continuous to the peripheral portion. In other respects, the arrangement is identical to that shown in FIG. 1.

In the arrangement illustrated in either of FIGS. 1 and 2 it is assumed that the semiconductor element 10 includes a defect on the outer peripheral portion and that in the operation thereof a fault current is concentrated on the defective portion of the element 10 until the defected portion reaches a temperature as high as a few thousand degrees centigrade. Such a high temperature will cause the partial melting of the outer peripheral portion of the semiconductor element 10, for example, the silicone substrate 10a and/or the surface coating 10d, resulting in the generation of a high temperature electric arc. If this high temperature arc is concentrated on the surfaces or surface of both or either of the silicone rubber layers 22a and 22b, the latter is first evaporated, to thereby exhibit the effect that the temperature arc decreases in temperature. Even though the high temperature arc is concentrated on the silicone rubber layer 22a and/or the silicone rubber layer 22b enough to locally evaporate such layer or layers, the arc is completely intercepted or shielded by both or either of the ceramic annuli 24a and 24b having the high thermal resistance. This ensures that the high temperature arc is inhibited from directly striking against both or either of the diaphragms 18a and 18b to fuse the same.

Therefore even if a high temperature electric arc such as above described occurs, it does not flow off externally of the semiconductor device. As a result, the high temperature arc is effectively prevented from shortcircuiting the arced semiconductor device with a charged portion of an associated device, thereby eliminating the danger of fire.

Further, an insulating and shielding member is composed of both the silicone rubber layers 22a and 22b and the ceramic annuli 24a and 24b forming double layer structures. Accordingly, the insulating and shielding member is enabled to sufficiently shield heat and electricity which could not be provided by the silicone rubber layers 22a and 22b alone. In semiconductor devices such as shown in FIGS. 1 and 2, the spaces defined by the diaphragms 18a and 18b, the semiconductor element 10 and the cylindrical insulating member 14 are very narrow so that it has been difficult to make the thermally and electrically shielding capability sufficiently high only by disposing the silicone rubber layers 22a and 22b in these narrow spaces. However it has been found that to bury a ceramic annulus 24a or 24b higher in thermal resistance than the silicone rubber forming the layers 22a or 22b into the latter is extremely effective for rendering the thermally and electrically shielding capability high.

In summary, it is seen that the present invention provides a semiconductor device comprising a high thermally resisting, electrically insulating member and an adhesive, electrically insulating layer disposed between a semiconductor element surrounded by a hollow cylindrical, electrically insulating member and a piece of thin sheet metal connecting the cylindrical insulating member to an electrode on either side of the semiconductor element. Therefore, even though a fault current is concentrated on the outer peripheral portion of the semiconductor element to melt such outer peripheral portion, a secondary accident such as a fire is prevented from occuring. Particularly, due to the double layer structure including the high thermally resisting, insulating member and the adhesive electrically insulating layer, protection against accidents can readily be increased as compared with semiconductor devices similar to the present device except for the omission of the high thermally resisting insulating member.

While the present invention has been illustrated and described in conjunction of a few preferred embodiments thereof, it is to be understood that numerous changes and modifications may be resorted to without departing from the spirit and scope of the present invention. For example, the adhesive electrically insulating layer may be formed of any suitable adhesive, electrically insulating member other than silicone rubber. Also, the high thermally resisting, electrically insulating member may be formed of any electrically insulating material other than the ceramic material as above described, as long as it is higher in thermal resistance than the adhesive, electrically insulating material of the layers 22a and 22b. For example, it may be formed of alumina.

What we claim is:

1. A semiconductor device comprising:
   a hollow, cylindrical electrically insulating member having first and second open opposite ends;
   a semiconductor element positioned within said insulating member and having first and second opposite surfaces facing said first and second open ends, respectively;
   first and second electrodes contacting said first and second opposite surfaces of said semiconductor element, respectively, said first and second electrodes sandwiching therebetween said semiconductor element within said housing member;
   first and second diaphragms extending outwardly from said first and second electrodes, respectively, to said insulating member, said first and second diaphragms hermetically sealing said first and second open ends of said insulating member;
   said first and second diaphragms forming within said insulating member respective first and second annular spaces extending peripherally outwardly of said first and second electrodes, respectively;
   first and second adhesive, electrically insulating layers attached to said first and second diaphragms, respectively, and at least partially filling said first and second annular spaces, respectively; and
   first and second high thermally resisting, electrically insulating annular-shaped members embedded in said first and second insulating layers, respectively.

2. A semiconductor device as claimed in claim 1, wherein said first electrode and said first diaphragm are integrally formed as a single member having a flat central portion comprising said first electrode and a peripheral portion comprising said first diaphragm.

3. A semiconductor device as claimed in claim 1, wherein said first and second high thermally resisting, electrically insulating annular-shaped members are formed of an electrically insulating material having a higher thermal resistance than the material of said first and second adhesive, electrically insulating layers.

4. A semiconductor device as claimed in claim 3, wherein said first and second adhesive, electrically insulating layers are composed of silicone rubber, and said first and second high thermally resisting, electrically insulating annular-shaped members are composed of a ceramic material.

5. A semiconductor device as claimed in claim 3, wherein said first and second adhesive, electrically insulating layers are composed of silicone rubber, and said first and second high thermally resisting, electrically insulating annular-shaped members are composed of alumina.

* * * * *